US008669553B2

(12) United States Patent
Knutson et al.

(10) Patent No.: US 8,669,553 B2
(45) Date of Patent: Mar. 11, 2014

(54) THIN FILM TRANSISTORS

(75) Inventors: Chris Knutson, Corvallis, OR (US);
Rick Presley, Lebanon, OR (US); John F. Wager, Corvallis, OR (US); Douglas Keszler, Corvallis, OR (US); Randy Hoffman, Corvallis, OR (US)

(73) Assignees: Hewlett-Packard Development Company, L.P., Houston, TX (US); Oregon State University, Corvallis, OR (US)

( * ) Notice: Subject to any disclaimer, the term of this patent is extended or adjusted under 35 U.S.C. 154(b) by 0 days.

(21) Appl. No.: 13/704,012

(22) PCT Filed: Jul. 2, 2010

(86) PCT No.: PCT/US2010/040924
§ 371 (c)(1),
(2), (4) Date: Dec. 13, 2012

(87) PCT Pub. No.: WO2012/002974
PCT Pub. Date: Jan. 5, 2012

(65) Prior Publication Data
US 2013/0092931 A1 Apr. 18, 2013

(51) Int. Cl.
*H01L 21/84* (2006.01)
*H01L 29/12* (2006.01)

(52) U.S. Cl.
USPC .............. 257/43; 257/E21.411; 257/E29.296; 438/158

(58) Field of Classification Search
None
See application file for complete search history.

(56) References Cited

U.S. PATENT DOCUMENTS

| 5,459,107 | A | 10/1995 | Palmour |
| 2004/0105042 | A1 | 6/2004 | Huang et al. |
| 2005/0218403 | A1 | 10/2005 | Kuo |
| 2006/0079034 | A1 | 4/2006 | Hoffman et al. |
| 2007/0272922 | A1 | 11/2007 | Kim et al. |
| 2009/0032812 | A1* | 2/2009 | Herman et al. ................. 257/43 |
| 2009/0140243 | A1 | 6/2009 | Kim et al. |
| 2010/0025675 | A1 | 2/2010 | Yamazaki et al. |

OTHER PUBLICATIONS

Hong et al., "Passivation of Zinc-tin-Oxide Thin-Film Transistors", J. Vac. Sci Technology B, vol. 23. Issue 6, Abstract, Nov. 2005 (1 page).
International Search Report and Written Opinion for PCT/US2010/040924 dated 4 Mar. 2011 (9 pages).

* cited by examiner

*Primary Examiner* — Michael Lebentritt
*Assistant Examiner* — Kevin Quinto

(57) ABSTRACT

A thin-film transistor includes a gate electrode, a gate dielectric disposed on the gate electrode, a channel layer, and a passivation layer. The channel layer has a first surface and an opposed second surface, where the first surface is disposed over at least a portion of the gate dielectric. The channel layer also has a first oxide composition including at least one predetermined cation. The passivation layer is disposed adjacent to at least a portion of the opposed second surface of the channel layer. The passivation layer has a second oxide composition including the at least one predetermined cation of the first oxide composition and at least one additional cation that increases a bandgap of the passivation layer relative to the channel layer.

17 Claims, 3 Drawing Sheets

THIN FILM TRANSISTORS

STATEMENT REGARDING FEDERALLY SPONSORED RESEARCH OR DEVELOPMENT

This invention was made with government support under HR0011-06-1-0045 awarded by the DOD/DARPA—Defense Advanced Research Projects Agency. The government has certain rights in the invention.

BACKGROUND

The present disclosure relates generally to thin film transistors.

Electronic devices, such as, for example, displays, solar cells, and integrated circuits, often include multiple electrical components. One example of an electrical component is a thin film transistor. In some electronic devices, many thin film transistors are coupled together to form circuitry. Oxide-based thin film transistors have been developed that provide high mobility, electrical stability, relatively low temperature processing, and ease of integration using existing manufacturing techniques.

BRIEF DESCRIPTION OF THE DRAWINGS

Features and advantages of embodiments of the present disclosure will become apparent by reference to the following detailed description and drawings, in which like reference numerals correspond to similar, though perhaps not identical, components. For the sake of brevity, reference numerals or features having a previously described function may or may not be described in connection with other drawings in which they appear.

DETAILED DESCRIPTION

Embodiments of the thin film transistor disclosed herein include a passivation layer having a composition that is paired with the underlying channel layer. The channel layer is a semiconductor oxide, and the paired passivation layer is an oxide having a similar composition to that of the channel layer, except that the passivation layer also includes one or more additional species that increases the bandgap of the passivation layer relative to the channel layer. In an example embodiment, due to incorporation of the one or more additional species, the passivation layer is an electrically inactive material that is not conductive (i.e., has a negligible population of equilibrium free or mobile charge carriers, less than about $10^{15}/cm^3$) and will not become conductive in the presence of a moderate electric field (i.e., an electric field equal to or less than about 0.5 MV/cm). As such, embodiments of the passivation layer disclosed herein establish and maintain a channel back-surface interface having a physical and chemical nature that enables desirable device operation (e.g., prevents the channel layer from becoming highly conductive). Embodiments of the passivation layer disclosed herein also provide i) electrical, chemical, and physical isolation of the thin film transistor and interconnect metal from subsequently formed overlying layers (e.g., additional interconnect levels, display elements such as pixel plates, liquid crystal material, etc.), and ii) chemical and physical isolation of the thin film transistor from environmental species (e.g., atmospheric moisture) that may change device performance.

Figure 1:
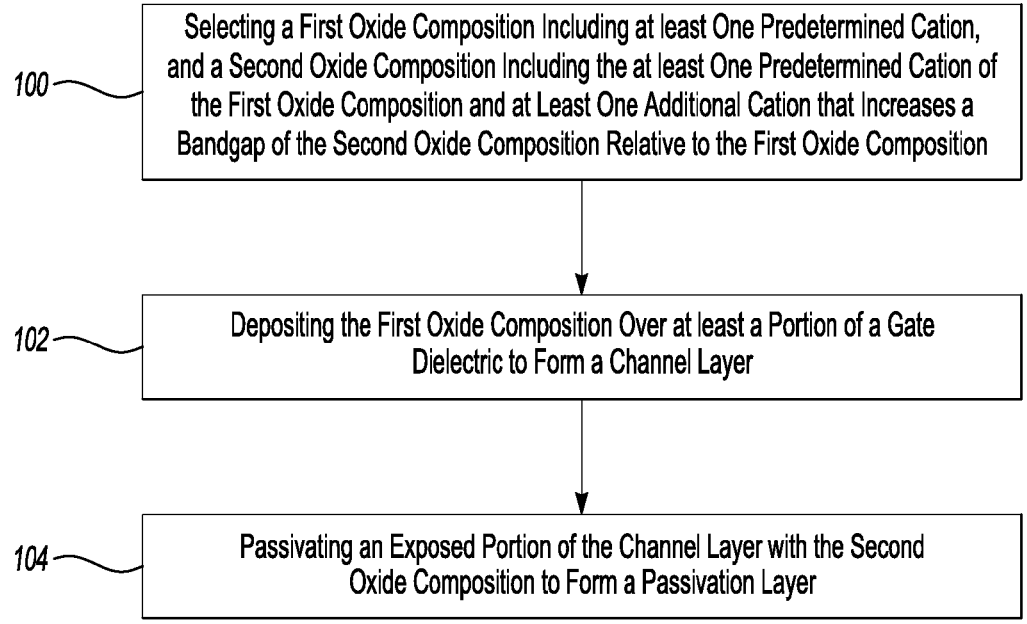
FIG. 1 is a flow diagram illustrating an embodiment of a method for forming an embodiment of a thin film transistor.

Referring now to FIG. 1, an embodiment of a method for forming an embodiment of the thin film transistor is depicted. Generally, this embodiment of the method includes selecting a first oxide composition including at least one predetermined cation, and a second oxide composition including the at least one predetermined cation of the first oxide composition and an additional cation that increases a bandgap of the second oxide composition relative to the first oxide composition, as shown at reference numeral 100; depositing the first oxide composition over at least a portion of a gate dielectric to form a channel layer, as shown at reference numeral 102; and passivating an exposed portion of the channel layer with the second oxide composition to form a passivation layer, as shown at reference numeral 104. It is to be understood that the method shown in FIG. 1 will be described in further detail in reference to FIG. 2.

Figure 2:
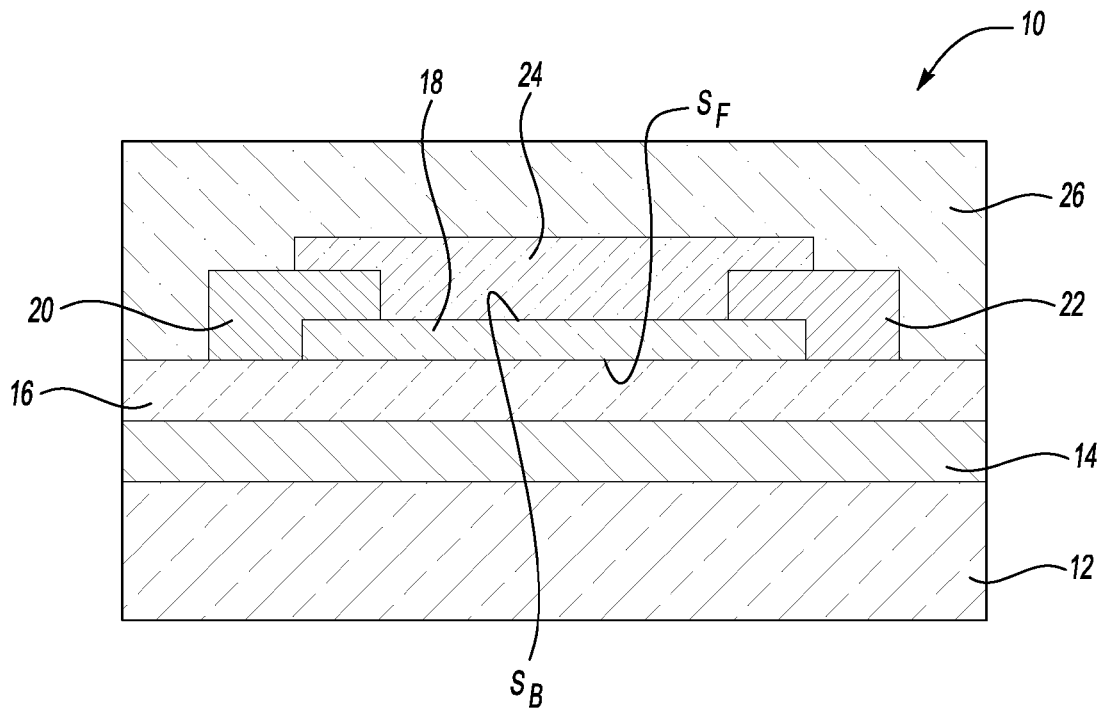
FIG. 2 is a cross-sectional view of an embodiment of a thin film transistor.

An embodiment of the thin film transistor 10 is shown in FIG. 2. The thin film transistor 10 includes a substrate 12 upon which the various components of the transistor 10 are stacked. Any material exhibiting properties suitable for application as a substrate in an electronic device may be selected. Examples of suitable substrates 12 include, but are not limited to glass, plastic/organic materials, metal, and/or combinations thereof. Furthermore, the substrate 12 may be mechanically rigid or flexible. Examples of rigid substrates include, but are not limited to glass or silicon. Examples of flexible substrates include, but are not limited to organic substrate materials such as polyimide (PI), polyethylene terephthalate (PET), polyethersulfone (PES), acrylic, polycarbonate (PC), polyethylenenaphthalate (PEN), or combinations thereof; metal foils; and/or combinations thereof. When the substrate 12 includes an electrically conductive material (such as a metal foil), an electrically insulating layer is included between the electrically conductive portion of the substrate 12 and any adjacent thin film transistors and other circuitry. The substrate 12 may have any thickness (i.e., height) which depends, at least in part, upon the size and configuration of the device into which the thin film transistor 10 is to be incorporated.

A gate electrode 14 is positioned on all or a portion of the substrate 12. In one embodiment, the gate electrode 14 is made up of aluminum. In another embodiment, the gate electrode 14 is a doped (conductive) silicon wafer. Still other examples of suitable gate electrodes include doped (conductive) oxide semiconductors, such as n-type doped zinc oxide, indium oxide, tin oxide, or indium tin oxide, and/or metals, such as Al, Cu, Mo, Ti, W, Ta, Ag, Au, and/or Ni. The gate electrode 14 may be deposited via any suitable technique, including, but not limited to sputter deposition, thermal evaporation, electron-beam evaporation, screen printing, solution processing, electroplating, electroless plating, inkjet printing, and/or spin coating deposition processes. When it is desirable to deposit the gate electrode 14 on a portion of the substrate 12, one or more patterning processes may also be used to establish the gate electrode 14 in suitable position(s).

The gate electrode 14 may be deposited to any suitable thickness ranging from about 50 nm to about 500 nm. In one non-limiting example, the gate electrode thickness ranges from about 100 nm to about 300 nm. The gate electrode 14 may additionally be used to form electrical interconnections between various portions of an electronic circuit, for example between different thin film transistor devices 10 on a substrate 12.

As illustrated in FIG. 2, the thin film transistor 10 also includes a gate dielectric layer 16 positioned on the gate electrode 14. In an embodiment, the gate dielectric layer 16 may be formed of an inorganic dielectric material (e.g., silicon oxide, silicon nitride, silicon oxynitride, aluminum oxide, hafnium oxide, zirconium oxide, tantalum oxide, yttrium oxide, lanthanum oxide, barium zirconate titanate, and/or barium strontium titanate) and/or an organic dielectric material (such as poly methyl methacrylate (PMMA), poly vinylphenol (PVP), various other polymers, benzocyclobutene (BCB), ultraviolet or thermal curable monomers, and/or the like). The gate dielectric layer 16 may also be deposited via any suitable technique, including, but not limited to chemical vapor deposition (CVD), plasma-enhanced chemical vapor deposition (PECVD), sputtering (including DC, DC-pulse, and/or RF sputtering), atomic layer deposition (ALD), thermal evaporation, electron-beam evaporation, screen printing, solution processing, pulsed laser deposition (PLD), inkjet printing, and/or spin coating deposition processes. In one embodiment, the thickness of the gate dielectric layer 16 is 100 nm. Suitable thickness ranges for the gate dielectric layer 16 include from about 10 nm to about 1000 nm, or from about 100 nm to about 500 nm.

A channel layer 18 is formed on the gate dielectric layer 16 and has two opposed surfaces $S_F$ and $S_B$. The surface $S_F$ is referred to herein as the front surface and is the surface $S_F$ of the channel layer 18 that is adjacent to the gate dielectric layer 16. The surface $S_B$, which is opposite to the surface $S_F$, is referred to herein as the back surface and is the surface $S_B$ of the channel layer 18 that is adjacent to a subsequently deposited passivation layer 24.

The channel layer 18 is an oxide semiconductor having one or more cations therein. The one or more cations are selected from zinc, tin, indium, and gallium. The oxide semiconductor channel layer 18 may have one of the listed cations, or two or more of the listed cations. Some non-limiting examples of the oxide semiconductor channel layer 18 include zinc oxide, zinc tin oxide, zinc indium oxide, indium gallium zinc oxide, indium gallium oxide, or other oxides of the listed cations. In one embodiment, the semiconductor channel layer 18 includes zinc tin oxide with an atomic ratio of Zn:Sn equaling 2:1. In another embodiment, the semiconductor channel layer 18 includes zinc tin oxide with an atomic ratio of Zn:Sn in a range of about 9:1 to about 1:9.

The channel layer 18 may also be intentionally or unintentionally doped. Intentional dopants are those that are deliberately added to the composition, and unintentional dopants are impurities or other species that are not deliberately added to the composition. Intentional dopants may be selected from aluminum, nitrogen, hydrogen, and combinations thereof. When included, the intentional dopants may be added so that they make up from about 0.5 atomic % to about 4 atomic % of all of the species present in the oxide semiconductor composition. As a non-limiting example, for an oxide semiconductor composition defined by Zn:Sn:O 2:1:4 atomic ratio, aluminum may be added as an intentional dopant such that the added aluminum makes up about 0.5 atomic % to about 4 atomic % of all of the zinc, tin, oxygen, and aluminum in the resulting oxide semiconductor composition. In some instances, there are no intentional dopants present in the oxide semiconductor channel layer 18. Unintentional dopants are usually equal to or less than 2 atomic % of all of the species present in the oxide semiconductor composition. In some instances, unintentional dopants may be present at a negligibly small concentration, while in other instances, unintentional dopants may be present in a sufficiently large concentration which can impact material properties and associated device performance.

As illustrated in FIG. 2, the channel layer 18 is positioned so that the surface $S_F$ contacts at least a portion of the surface of the gate dielectric layer 16. The channel layer 18 (including any intentionally added dopants) may be deposited via any suitable technique, including, but not limited to sputter deposition (including DC, DC-pulse, and/or RF sputtering), atomic layer deposition (ALD), pulsed laser deposition (PLD), thermal evaporation, electron-beam evaporation, screen printing, solution processing, chemical vapor deposition (CVD), plasma-enhanced chemical vapor deposition (PECVD), inkjet printing, and/or spin coating deposition processes. Suitable patterning processes may be used in conjunction with the deposition process(es) in order to establish the channel layer 18 in a suitable position. Pattern definition may be accomplished using, for example, photolithography or shadow mask type processes, and material removal may be accomplished using, for example, wet or dry etching (including reactive ion etching) or lift-off processes. Alternatively, direct-write type patterning may be accomplished using, for example, inkjet-type or other selective deposition of an appropriate liquid precursor solution.

The channel layer 18 may have any suitable thickness, and in one embodiment, this thickness ranges from about 10 nm to about 300 nm. In another embodiment, the channel layer 18 thickness ranges from about 25 nm to about 100 nm. In one non-limiting example, the thickness of the channel layer 18 is about 50 nm.

After being deposited, the channel layer 18 may be exposed to an annealing process. Annealing may be accomplished in air, or in another suitable atmosphere, such as oxygen, nitrogen, argon, and/or mixtures thereof. Water vapor may be added to the annealing ambient to provide a wet anneal. The time and temperature for annealing may vary depending upon the material used for the channel layer 18. In one non-limiting example, the annealing time ranges from about 5 minutes to about 2 hours, and the annealing temperature ranges from about 150° C. to about 400° C. In some instances, the upper end of the temperature range may be extended to about 500° C.

Figure 3:
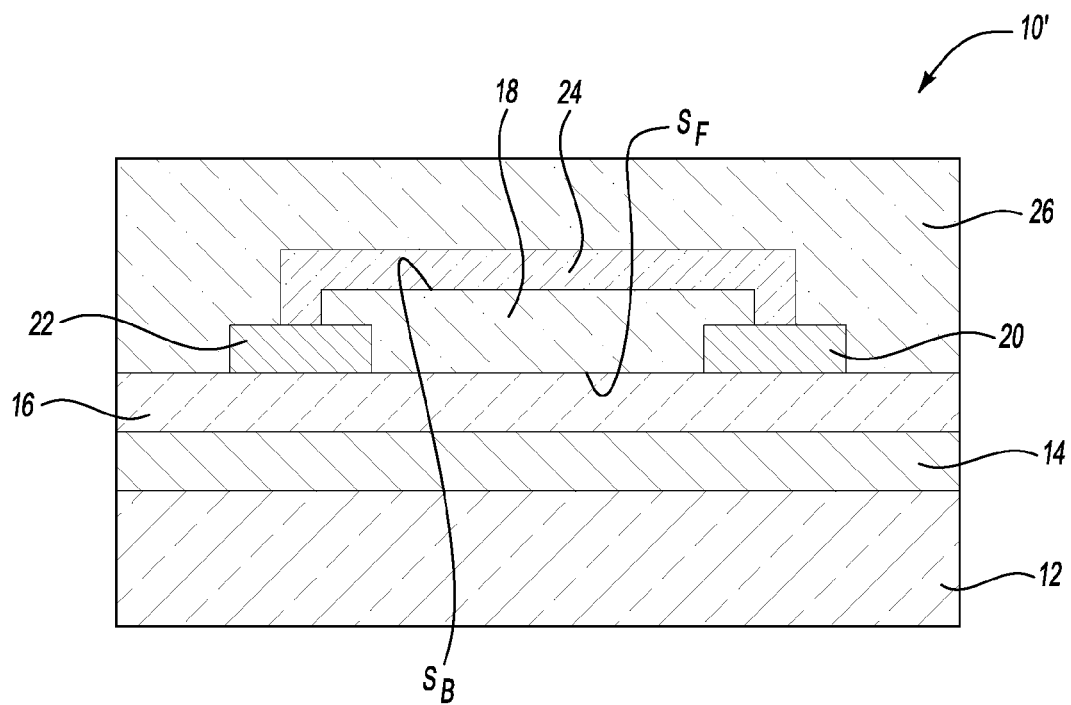
FIG. 3 is a cross-sectional view of another embodiment of a thin film transistor.

Once the channel layer 18 is established, source and drain electrodes 20, 22 may be deposited and patterned such that each i) is electrically connected to the channel layer 18 and ii) extends across a portion of the back surface $S_B$ of the channel layer 18. As illustrated in FIG. 2, the source and drain electrodes 20, 22 are positioned such that they are isolated from one another on the back surface $S_B$. Therefore, during deposition and patterning of the source and drain electrodes 20, 22, a portion of the back surface $S_B$ remains exposed. This exposed portion is located between the final source and drain electrodes 20, 22 and ultimately has a passivation layer 24 established thereon. Alternately, the source and drain electrodes 20, 22 may be deposited and patterned before establishing the channel layer 18, thus contacting a portion of the front surface $S_F$ of channel layer 18. This embodiment of the thin film transistor 10' is shown in FIG. 3. In this embodiment, the subsequently established passivation layer 24 is deposited and patterned to cover any exposed portions of the channel layer 18.

The source and drain electrodes 20, 22 may be made of one or more types of suitable conductive materials, including metals (e.g., Mo, Cu, W, Al, Ti, Ag, Au, and/or Ni) or doped oxide semiconductors (e.g., n-type doped indium tin oxide, zinc oxide, indium oxide, or tin oxide). In one embodiment, the thickness of each of the source and drain electrodes 20, 22 ranges from about 50 nm to about 500 nm. In another embodiment, the thickness of each of the source and drain electrodes 20, 22 ranges from about 100 nm to about 300 nm.

After the channel layer 18 and source and drain electrodes 20, 22 are established, the passivation layer 24 (also referred to herein as the channel passivation layer or the first passivation layer) is formed. It is to be understood that the materials used to form the passivation layer 24 depend upon the materials selected for the channel layer 18. More particularly, the passivation layer 24 is an oxide that includes the cation(s) of the channel layer 18 (e.g., indium, gallium, tin and/or zinc) as well as one or more additional cations which increase the bandgap of the passivation layer 24 relative to the channel layer 18. In particular, the additional cation(s) is/are selected so that the resulting passivation layer 24 has a wider bandgap than the bandgap of the channel layer 18. These additional cation(s) are also not present in the channel layer 18. Examples of the additional cation(s) include, but are not limited to, aluminum, boron, hafnium, magnesium, niobium, silicon, tantalum, yttrium, zirconium, and combinations thereof. The amount of additional cation(s) present in the oxide composition of the passivation layer 24 ranges from about 20 atomic % to about 70 atomic % of the total cation species in the passivation layer oxide composition.

When the channel layer 18 includes one or more dopant species as previously defined, the one or more additional cations of the passivation layer 24 may be the same as the one or more dopant species of the channel layer 18. For example, if the channel layer 18 is zinc tin oxide doped with aluminum (the aluminum dopant being present at a concentration ranging from about 0.5 atomic % to about 4 atomic % of all species in the channel layer 18 as previously specified), the passivation layer 24 may be zinc tin aluminum oxide (with aluminum present at a concentration ranging from about 20 atomic % to about 70 atomic % of total cation species in the passivation layer 24 as previously specified). In this and other like examples, the difference between the channel layer 18 and the passivation layer 24 is established by the relatively different concentration at which the dopant/cation (e.g., aluminum) species is present.

As mentioned above, following establishing of the channel layer 18 and source and drain electrodes 20, 22 (regardless of the order in which these components are formed), there remains an exposed portion of the back surface $S_B$ of the channel layer 18. The passivation layer 24 is established on this exposed portion of the back surface $S_B$. In the embodiment shown in FIG. 2, the passivation layer 24 extends at least up to the edges of source and drain electrodes 20, 22, and may extend onto and beyond source and drain electrodes 20, 22. Similarly, in the embodiment shown in FIG. 3, the passivation layer 24 extends at least up to the adjacent surfaces of the source and drain electrodes 20, 22, and may, in some instances, extend over and beyond the source and drain electrodes 20, 22. In one embodiment, the thickness of passivation layer 24 ranges from about 20 nm to about 300 nm. The passivation layer 24 may be deposited via any suitable technique, including, but not limited to sputter deposition (including DC, DC-pulse, and/or RF sputtering), pulsed laser deposition (PLD), thermal evaporation, electron-beam evaporation, screen printing, solution processing, inkjet printing, and/or spin coating deposition processes, and may be patterned using any suitable patterning technique, such as photolithographic patterning combined with wet or dry etching.

Some non-limiting examples of the paired channel layer 18 and passivation layer 24 include zinc tin (2:1 atomic) oxide and zinc tin aluminum (1:1:1 atomic) oxide, or zinc tin (2:1 atomic) oxide and zinc tin silicon (1:1:1 atomic) oxide, or zinc indium (2:1 atomic) oxide and zinc indium aluminum (1:1:1 atomic) oxide, or zinc indium (2:1 atomic) oxide and zinc indium silicon (1:1:1 atomic) oxide.

Since the passivation layer 24 disclosed herein has a similar composition to the underlying channel layer 18, there is a relatively non-abrupt material boundary at the interface of the layers 18, 24, and thus inherent disorder, electrical defects, and structural defects at this interface are reduced (compared to the amount of defects present at an interface with an abrupt material boundary, such as, for example, an interface between a zinc tin oxide channel layer and a silicon dioxide passivation layer). The increased bandgap and insulating properties of the passivation layer 24 also provides an electrical boundary at the channel back surface $S_B$. This may contribute to desirable device properties, such as thermal, chemical, and/or electrical stability. The similar composition also reduces or eliminates undesirable chemical modification of the channel back surface $S_B$ during the passivation deposition. This may reduce or eliminate chemical reduction of the channel back surface $S_B$, which in turn reduces or eliminates an unwanted increase in free electron concentration (conductivity) at the channel back surface $S_B$.

After being deposited, the passivation layer 24 may also be exposed to an annealing process. Annealing may be accomplished in air, or in another suitable atmosphere, such as nitrogen, oxygen, argon, and/or mixtures thereof. The time and temperature for annealing may vary depending upon the material used for the passivation layer 24. In one non-limiting example, the annealing time ranges from about 5 minutes to about 2 hours, and the annealing temperature ranges from about 150° C. to about 400° C.

The embodiments of the thin film transistor 10, 10' shown in FIGS. 2 and 3 may also include a second passivation layer 26 that is deposited over the passivation layer 24, and in some instances over exposed portions of the source and drain electrodes 20, 22 and exposed portions of the gate dielectric layer 16. This passivation layer 26 contributes to further electrically, physically, and chemically isolating the channel layer 18 and electrical interconnect layers including source and drain electrodes 20, 22 from subsequent overlying layers and/or environmental factors. Due to the fact that the channel layer 18 already has a similar composition passivation layer 24 deposited thereon (i.e., protecting the back surface $S_B$), the second passivation layer 26 may be selected without taking into consideration the materials used to form the channel layer 18. In one embodiment, the second passivation layer 26 is selected from aluminum oxide, hafnium oxide, silicon nitride, silicon oxide, silicon oxynitride, and zirconium oxide.

The second passivation layer 26 may be formed using the techniques described for the passivation layer 24, or may be formed using plasma enhanced chemical vapor deposition (PECVD). PECVD may be suitable for depositing the second passivation layer 26 because the passivation layer 24 protects the channel layer 18 from potentially deleterious effects of the PECVD process.

In one embodiment, the thickness of the second passivation layer 26 ranges from about 100 nm to about 500 nm.

Figure 4:
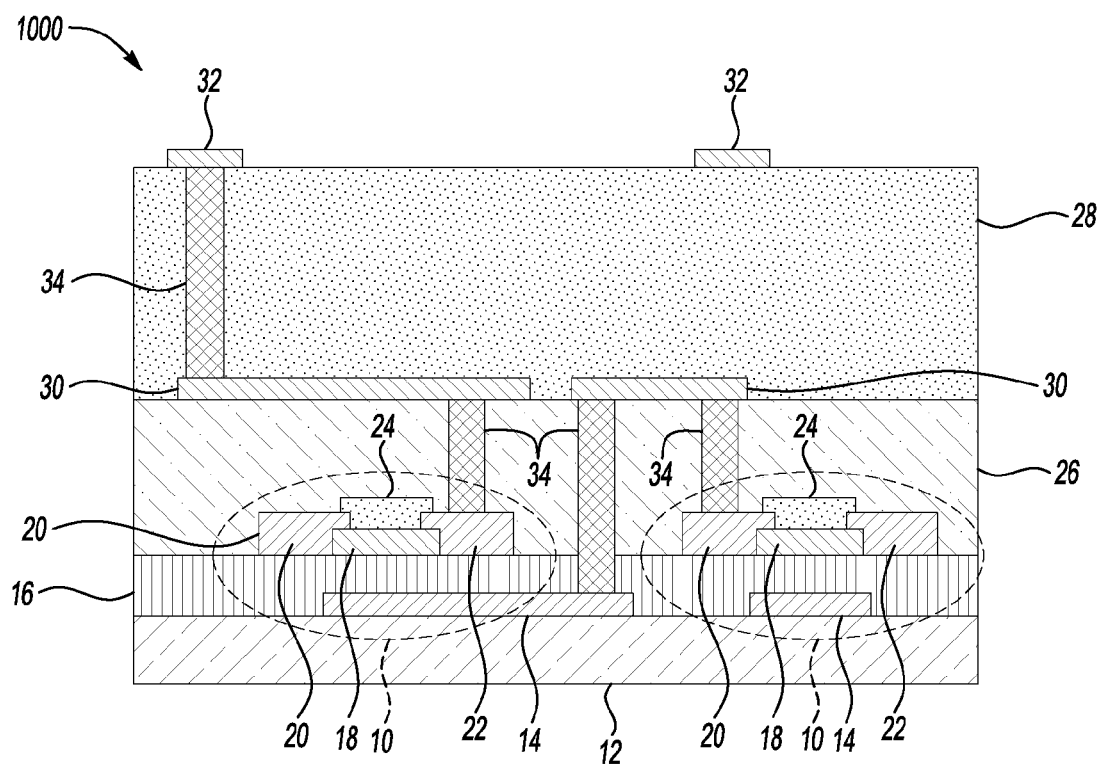
FIG. 4 is a cross-sectional view of a portion of an embodiment of a device including a plurality of thin film transistors.

Referring now to FIG. 4, a cross-sectional view of a portion of one embodiment of an electronic device 1000 including multiple thin film transistors 10 is shown. The thin film transistors 10 are each made with the various layers 12, 14, 16, 18, 20, 22, 24, and 26 described herein in reference to FIG. 2. The device 1000 also includes one or more additional layers formed on or over at least a portion of the thin film transistors 10. These additional layers may include one or more dielectric layers and/or interconnects, for example, which may provide interconnection between the thin film transistors 10 and/or to one or more other components formed on the same layer or on or over subsequent layers.

In the embodiment shown in FIG. 4, interconnect levels 30 and/or 32, and/or vias 34 are used to electrically couple various circuit portions or components, e.g., connecting gate electrode 14 of one thin film transistor 10 to the source and/or drain electrodes 20, 22 of another thin film transistor 10. It is to be understood that this is one example of how components may be electrically coupled, and that the disclosure is not limited to this particular example. Interconnects 30, 32 and/or vias 34 may be formed of one or more conducting materials, such as a suitable metal (e.g., Al, Mo, Cu, Ag, Ti, Au, and/or Ni) or conducting oxide (e.g., n-type doped zinc oxide, indium oxide, tin oxide, and/or indium tin oxide).

FIG. 4 also illustrates a third passivation layer 28 formed on or over at least a portion of the second passivation layer 26. The third passivation layer 28 provides a surface for depositing an additional interconnect level (e.g., 32) that is electrically and physically isolated from interconnect level 30, and further provides an environment in which other thin film transistor(s) 10 may be incorporated.

The portion of the electronic device 1000 shown in FIG. 4 could be part of a display device, such as a portion of a backplane of an active-matrix liquid crystal display (AM-LCD) device, or part of a smart package. Additionally, in the embodiments disclosed herein, the particular configurations of the thin film transistors 10 or 10' may be referred to as bottom-gate configurations, meaning, in this context, that the gate electrode 14 is configured beneath the gate dielectric 16, i.e., configured on the surface of the gate dielectric layer 16 closest to the substrate 12. However, it is to be understood that the instant disclosure is not limited to this configuration. For example, particular embodiments of the thin film transistor 10 or 10' may have a top-gate configuration, in which the gate electrode 14 is configured above the gate dielectric 16, i.e., configured on or over the surface of the gate dielectric layer 16 furthest from the substrate 12, for example.

To further illustrate embodiment(s) of the present disclosure, the following examples are given herein. It is to be understood that these examples are provided for illustrative purposes and are not to be construed as limiting the scope of the disclosed embodiment(s). The device of Example 1 and the device of the Comparative Example both had a width to length ratio (W/L) equal to 10.

EXAMPLE 1

A thin film transistor according to an embodiment disclosed herein was fabricated on a silicon substrate. In this test structure, a doped (conductive) silicon wafer served as both the substrate and the gate electrode, and a thermally-grown silicon dioxide layer on the silicon wafer served as the gate dielectric. The thickness of the silicon dioxide gate dielectric layer was 100 nm.

A zinc tin oxide (Zn:Sn 2:1 atomic ratio, also referred to as ZTO or ZnSnOx) channel layer (60 nm thick) was deposited on a portion of the gate dielectric using sputter deposition and patterned using a metal shadow-mask during deposition. After zinc tin oxide channel deposition, the structure was annealed in air at 500° C. for about 1 hour. Indium tin oxide (ITO) source and drain electrodes (100 nm thick) were then deposited (using sputter deposition) and patterned (using a metal shadow-mask during deposition) on opposed ends of the channel layer such that the two were separated by an exposed portion of the underlying ZTO channel layer.

The first passivation layer (100 nm thick) was then deposited (using sputter deposition) onto the exposed ZTO channel layer and on portions of the adjacent source and drain electrodes. The first passivation layer was patterned using a metal shadow-mask during deposition. In this example, zinc tin silicon oxide (Zn:Sn:Si 1:1:1 atomic ratio, also referred to as ZTSiO or (ZnSnSi)Ox) was selected for the first passivation layer. After deposition of the first passivation layer, the structure was annealed in air at 300° C. for about 1 hour.

A second passivation layer (100 nm thick) was deposited over the first passivation layer and any exposed portions of the other device components (e.g., source and drain electrodes and the gate dielectric). Silicon dioxide was selected for the second passivation layer. The silicon dioxide was deposited using PECVD and was subsequently patterned using reactive ion etching (RIE) through a metal shadow-mask.

The electrical performance for the thin film transistor (TFT) formed in Example 1 was tested at several points in the fabrication sequence, measuring drain current versus gate-to-source voltage ($I_D$-$V_{GS}$ transfer curves). In particular, the electrical performance was measured i) before (ZnSnSi)Ox passivation, ii) after (ZnSnSi)Ox passivation and before the second annealing step, iii) after (ZnSnSi)Ox passivation and the second annealing step, and iv) after PECVD silicon dioxide passivation. The results from each measurement are shown in FIG. 5.

Figure 5:
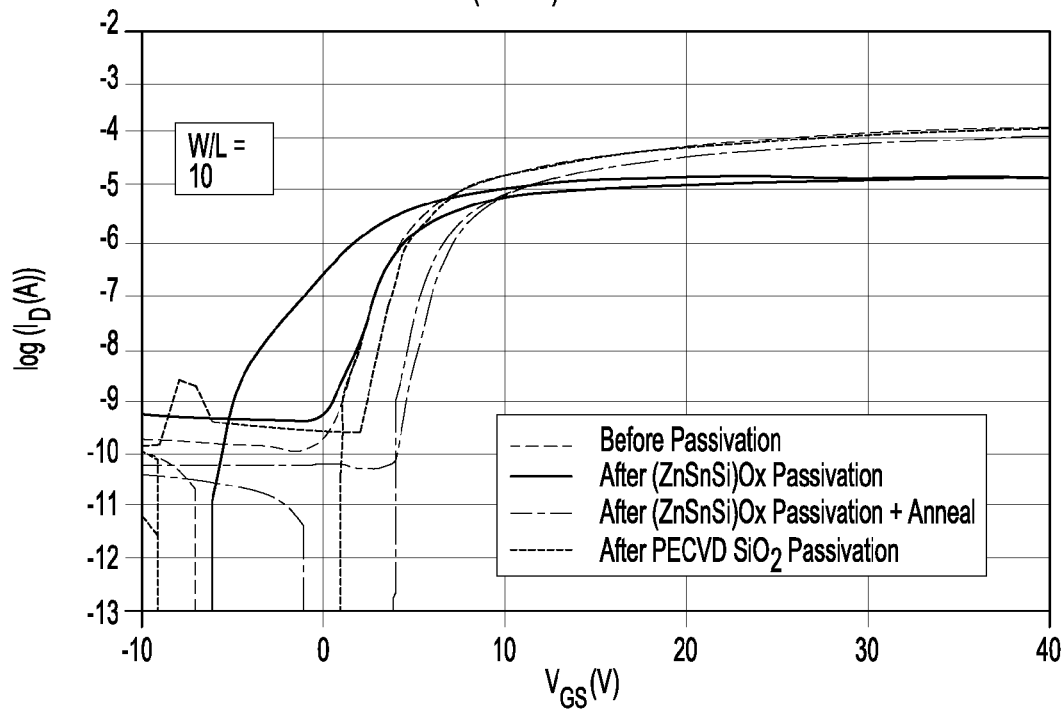
FIG. 5 is a graph illustrating $I_D$-$V_{GS}$ (drain current vs. gate-to-source voltage) transfer curves measured throughout the fabrication of an embodiment of the thin film transistor disclosed herein.

As shown in FIG. 5, throughout the fabrication sequence, the TFT behavior remains relatively unchanged. The largest effect observed was a reduction in mobility after the (ZnSnSi)Ox deposition, which was recovered by the second annealing step. The final passivated TFT performance is virtually identical to that of the unpassivated device. It is believed that the addition of the first passivation layer provides an electrical, chemical, and/or physical boundary that prevents the TFT from degradation during subsequent PECVD silicon dioxide passivation processing.

COMPARATIVE EXAMPLE

A comparative thin film transistor was also fabricated on a silicon substrate. In this test structure, a doped (conductive) silicon wafer served as both the substrate and the gate electrode, and a thermally-grown silicon dioxide layer on the silicon wafer served as the gate dielectric. The thickness of the silicon dioxide gate dielectric layer was 100 nm.

A zinc tin oxide (Zn:Sn 2:1 atomic ratio, also referred to as ZTO or ZnSnOx) channel layer (60 nm thick) was deposited on a portion of the gate dielectric using sputter deposition and patterned using a metal shadow-mask during deposition. After zinc tin oxide channel deposition, the structure was annealed in air at 500° C. for about 1 hour. Indium tin oxide (ITO) source and drain electrodes (100 nm thick) were then deposited (using sputter deposition) and patterned (using a metal shadow-mask during deposition) on opposed ends of the channel layer such that the two were separated by an exposed portion of the underlying ZTO channel layer.

A passivation layer (100 nm thick) was then deposited using PECVD onto the exposed ZTO channel layer and on portions of the adjacent source and drain electrodes. The deposited passivation layer was subsequently patterned using reactive ion etching (RIE) through a metal shadow-mask. In this example, silicon dioxide was selected for the passivation layer. This structure was then annealed in air at 300° C. for about 1 hour.

The electrical performance for the comparative thin film transistor (TFT) was tested at several points in the fabrication sequence, measuring drain current versus gate-to-source voltage ($I_D$-$V_{GS}$ transfer curves). In particular, the electrical performance was measured i) before silicon dioxide passivation, ii) after silicon dioxide passivation and before the second annealing step, and iii) after silicon dioxide passivation and the second annealing step. The results from each measurement are shown in FIG. 6.

Figure 6:
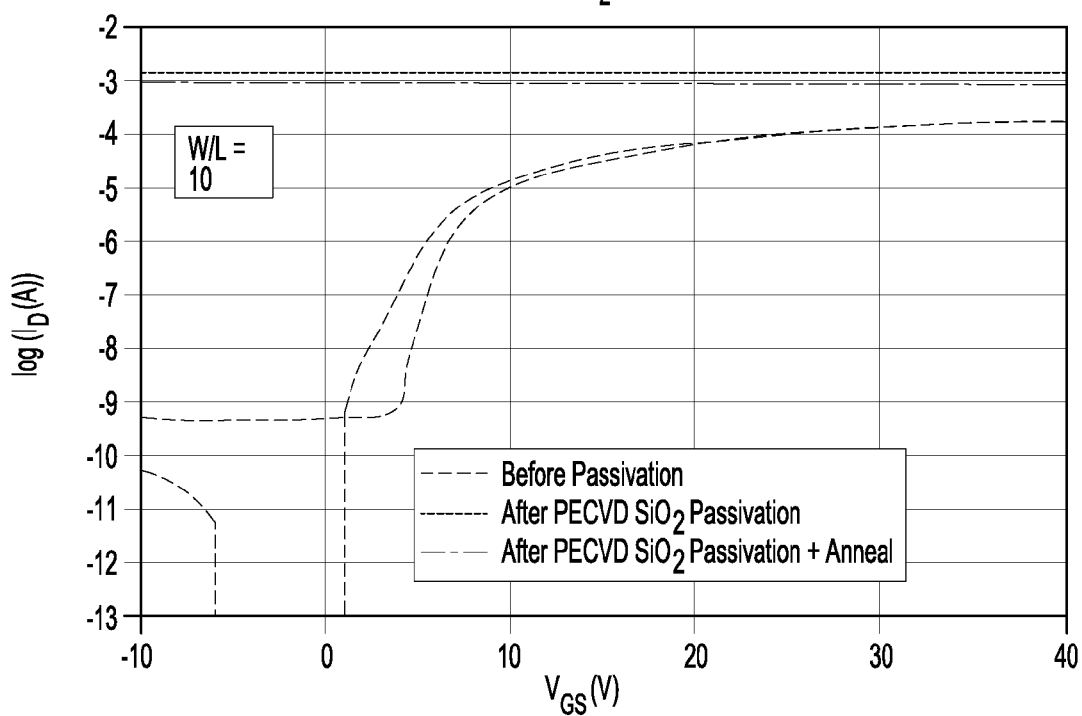
FIG. 6 is a graph illustrating $I_D$-$V_{GS}$ (drain current vs. gate-to-source voltage) transfer curves measured throughout the fabrication of a comparative thin film transistor.

As shown in FIG. 6, throughout the fabrication sequence, the TFT behavior degrades dramatically. In particular, the channel becomes highly conductive and the gate-to-source voltage ($V_{GS}$) does not effectively modulate drain current ($I_D$). Upon passivation with PECVD silicon dioxide, the initial (and desired) TFT functionality is not recovered with subsequent annealing.

It is to be understood that the ranges provided herein include the stated range and any value or sub-range within the stated range. For example, an amount ranging from about 1 wt % to about 20 wt % should be interpreted to include not only the explicitly recited amount limits of 1 wt % to 20 wt %, but also to include individual amounts, such as 2 wt %, 2.7 wt %, 3 wt %, 3.5 wt %, 4 wt %, etc., and any sub-ranges, such as 5 wt % to 15 wt %, 10 wt % to 20 wt %, etc. Furthermore, when "about" is used to describe a value, this is meant to encompass minor variations (up to 0.3) from the stated value.

While several embodiments have been described in detail, it will be apparent to those skilled in the art that the disclosed embodiments may be modified. Therefore, the foregoing description is to be considered exemplary rather than limiting.

What is claimed is:

1. A thin-film transistor, comprising:
   a gate electrode;
   a gate dielectric disposed on the gate electrode;
   a channel layer having a first surface and an opposed second surface, the first surface being disposed over at least a portion of the gate dielectric, the channel layer having a first oxide composition including at least one predetermined cation; and
   a passivation layer disposed adjacent to at least a portion of the opposed second surface of the channel layer, the passivation layer including a second oxide composition including the at least one predetermined cation of the first oxide composition and at least one additional cation that increases a bandgap of the passivation layer relative to the channel layer.

2. The thin-film transistor as defined in claim 1 wherein the at least one predetermined cation of the first oxide composition is selected from: indium, gallium, tin, zinc, and combinations thereof; and wherein the at least one additional cation of the second oxide composition is selected from of: aluminum, boron, hafnium, magnesium, niobium, silicon, tantalum, yttrium, zirconium, and combinations thereof.

3. The thin-film transistor as defined in claim 2 wherein the first oxide composition is zinc tin oxide and the second oxide composition is selected from zinc tin aluminum oxide and zinc tin silicon oxide, or wherein the first oxide composition is zinc indium oxide and the second oxide composition is selected from zinc indium aluminum oxide and zinc indium silicon oxide.

4. The thin-film transistor as defined in claim 1 wherein an amount of the at least one additional cation element in the second oxide composition ranges from about 20 atomic % to about 70 atomic % of total cation species in the second oxide composition.

5. The thin-film transistor as defined in claim 1, further comprising a second passivation layer disposed adjacent to the passivation layer, the second passivation layer being selected from aluminum oxide, hafnium oxide silicon nitride, silicon oxide, silicon oxynitride, and zirconium oxide.

6. The thin-film transistor as defined in claim 1, further comprising:
   at least one drain electrode in electrical contact with the channel layer; and
   at least one source electrode in electrical contact with the channel layer;
   wherein the passivation layer is positioned on the opposed second surface of the channel layer and covers at least an area between the at least one source electrode and the at least one drain electrode.

7. The thin-film transistor as defined in claim 1, wherein the first oxide composition includes at least one dopant species selected from aluminum, hydrogen, and nitrogen, and wherein the at least one dopant species is present in an amount ranging from 0.5 atomic % to 4 atomic % of all species present in the first oxide composition.

8. A thin-film transistor, comprising:
   a substrate;
   a gate electrode disposed on the substrate;
   a gate dielectric disposed on the gate electrode;
   a channel layer having a first surface and an opposed second surface, the first surface being disposed over at least a portion of the gate dielectric, the channel layer having a first oxide composition including at least one cation selected from zinc, tin, indium, and gallium;
   at least one drain electrode in electrical contact with the channel layer;
   at least one source electrode in electrical contact with the channel layer;
   a passivation layer disposed adjacent to at least a portion of the second opposed surface of the channel layer, the passivation layer having a second oxide composition including the at least one cation of the first oxide composition and at least one additional cation selected from aluminum, boron, hafnium, magnesium, niobium, silicon, tantalum, yttrium, and zirconium; and
   a second passivation layer disposed adjacent to the passivation layer, the second passivation layer being selected from aluminum oxide, hafnium oxide, silicon nitride, silicon oxide, silicon oxynitride, and zirconium oxide.

9. A method of forming a structure, comprising:
   selecting a first oxide composition including at least one predetermined cation, and second oxide composition including the at least one predetermined cation of the first oxide composition and at least one additional cation that increases a bandgap of the second oxide composition relative to the first oxide composition;
   depositing the first oxide composition over at least a portion of a gate dielectric to form a channel layer; and
   passivating an exposed portion of the channel layer with the second oxide composition to form a passivation layer.

10. The method as defined in claim 9 wherein the selecting of the first oxide composition includes selecting an oxide of: indium, gallium, tin, zinc, and combinations thereof; and wherein the selecting of the second oxide composition includes selecting the additional cation from the group consisting of aluminum, boron, hafnium, magnesium, niobium, silicon, tantalum, yttrium, zirconium, and combinations thereof.

11. The method as defined in claim 9 wherein passivating the exposed portion of the channel layer is accomplished using a vacuum deposition technique and a photolithographic patterning technique.

12. The method as defined in claim 11 wherein after forming the passivation layer, the method further comprises annealing the structure in air at a predetermined temperature ranging from about 150° C. to about 400° C. for a predetermined time ranging from about 5 minutes to about 2 hours.

13. The method as defined in claim 9 wherein prior to passivating the exposed portion of the channel layer, the method further comprises:
  depositing at least one drain electrode in electrical contact with a portion of the channel layer; and
  depositing at least one source electrode in electrical contact with an other portion of the channel layer;
  wherein the depositing of each of the at least one drain electrode and the at least one source electrode defines the exposed portion of the channel layer.

14. The method as defined in claim 9, further comprising depositing a second passivation layer adjacent to the passivation layer, the second passivation layer being selected from aluminum oxide, hafnium oxide, silicon nitride, silicon oxide, silicon oxynitride, and zirconium oxide.

15. The method as defined in claim 9 wherein prior to passivating the exposed portion of the channel layer, the method further comprises annealing the structure in air at a predetermined temperature ranging from about 150° C. to about 400° C. for a predetermined time ranging from about 5 minutes to about 2 hours.

16. The thin-film transistor as defined in claim 8 wherein the first oxide composition is zinc tin oxide and the second oxide composition is selected from zinc tin aluminum oxide and zinc tin silicon oxide, or wherein the first oxide composition is zinc indium oxide and the second oxide composition is selected from zinc indium aluminum oxide and zinc indium silicon oxide.

17. The thin-film transistor as defined in claim 8 wherein an amount of the at least one additional cation element in the second oxide composition ranges from about 20 atomic % to about 70 atomic % of total cation species in the second oxide composition.

* * * * *